(12) United States Patent
Gijsbers et al.

(10) Patent No.: US 11,430,933 B2
(45) Date of Patent: Aug. 30, 2022

(54) LIGHTING DEVICE WITH HIGH FLEXIBILITY IN CONNECTING ELECTRICAL COMPONENTS

(71) Applicant: Lumileds LLC, San Jose, CA (US)

(72) Inventors: Harry Gijsbers, Heerlen (NL); Georg Henninger, Aachen (DE)

(73) Assignee: Lumileds LLC, San Jose, CA (US)

( * ) Notice: Subject to any disclaimer, the term of this patent is extended or adjusted under 35 U.S.C. 154(b) by 78 days.

(21) Appl. No.: 16/807,596

(22) Filed: Mar. 3, 2020

(65) Prior Publication Data

US 2020/0287113 A1    Sep. 10, 2020

(30) Foreign Application Priority Data

Mar. 7, 2019    (EP) ..................................... 19161346

(51) Int. Cl.
| | |
|---|---|
| *H01L 33/62* | (2010.01) |
| *H01L 23/00* | (2006.01) |
| *H01L 33/64* | (2010.01) |
| *H01R 12/52* | (2011.01) |
| *H01R 12/58* | (2011.01) |
| *H01R 24/68* | (2011.01) |

(52) U.S. Cl.
CPC .............. *H01L 33/62* (2013.01); *H01L 24/48* (2013.01); *H01L 33/642* (2013.01); *H01R 12/52* (2013.01); *H01R 12/58* (2013.01); *H01L 2224/48157* (2013.01); *H01L 2933/0066* (2013.01); *H01L 2933/0075* (2013.01); *H01R 24/68* (2013.01)

(58) Field of Classification Search
CPC combination set(s) only.
See application file for complete search history.

(56) References Cited

U.S. PATENT DOCUMENTS

| | | | |
|---|---|---|---|
| 2004/0208210 A1* | 10/2004 | Inoguchi .............. | G02B 6/0073 257/E33.072 |
| 2005/0139846 A1* | 6/2005 | Park ........................ | H01L 33/62 438/22 |
| 2014/0231837 A1 | 8/2014 | Singer et al. | |

FOREIGN PATENT DOCUMENTS

| | | |
|---|---|---|
| FR | 3056702 A1 | 3/2018 |
| JP | 2013-012347 A | 1/2013 |
| WO | 2018/069231 A1 | 4/2018 |

* cited by examiner

*Primary Examiner* — Ratisha Mehta
(74) *Attorney, Agent, or Firm* — Volpe Koenig

(57) ABSTRACT

A lighting device and a method of manufacturing a lighting device are described. A lighting device includes a heat sink providing a first mounting area for at least one LED element, a second mounting area for at least one electrical connection assembly, and a cavity adjacent the first mounting area. An inner part is arranged at least partially inside the cavity and includes at least a first and a second connection terminal and at least one electrical connection path. The first and the second connection terminal are provided on a surface of the inner part. The first connection terminal is arranged between the first mounting area and the second connection terminal. The second connection terminal is arranged between the second mounting area and the first connection terminal. The electrical connection path is provided at least partially inside the inner part connecting the first and second electrical terminal.

20 Claims, 6 Drawing Sheets

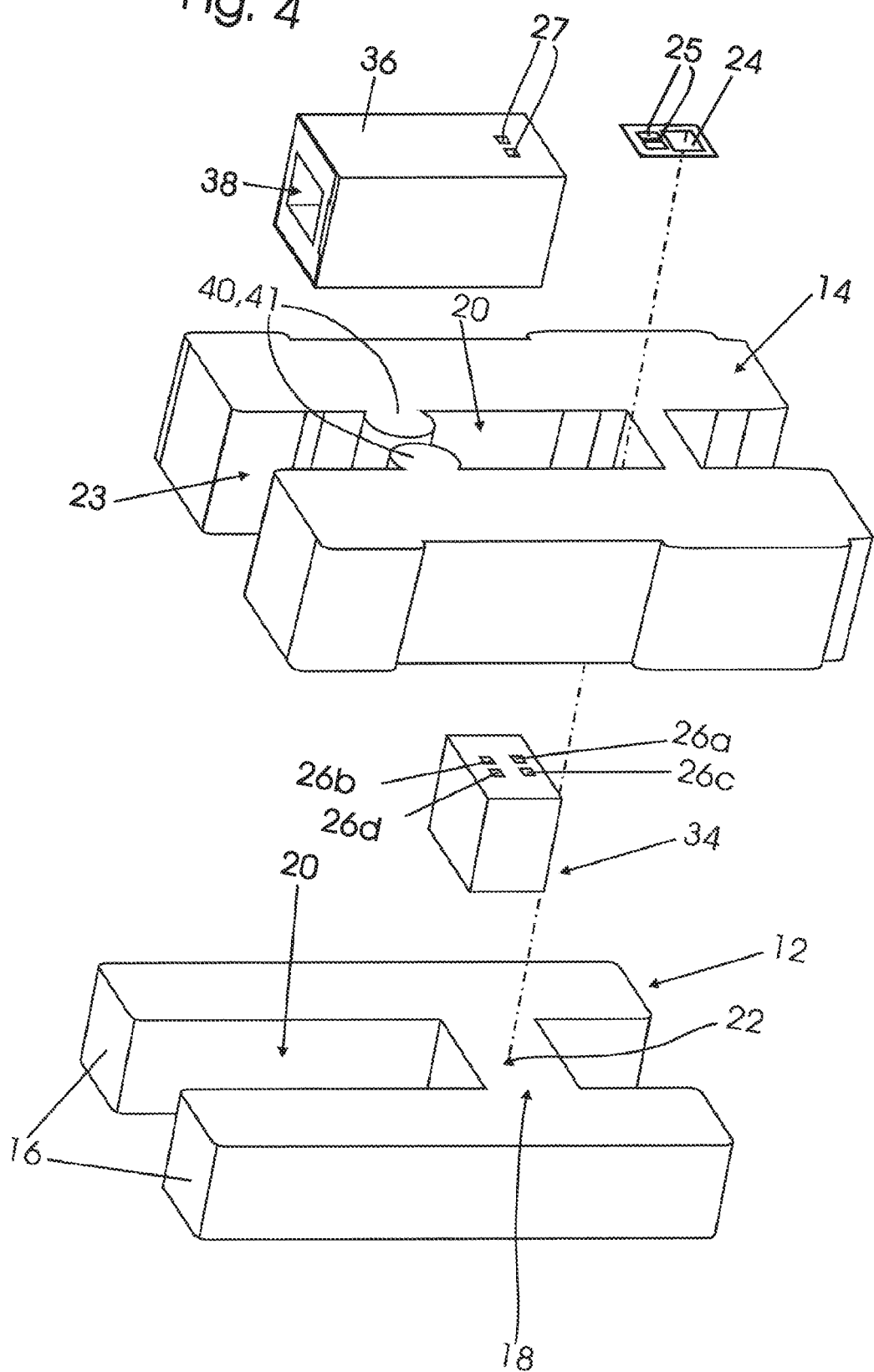

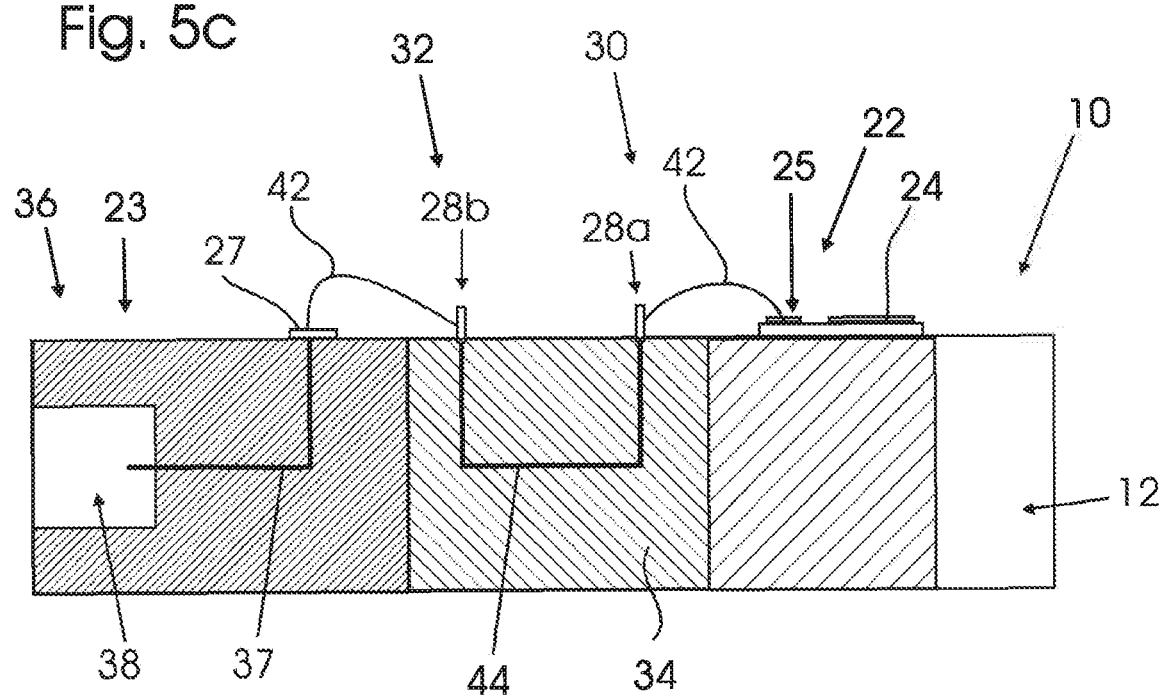
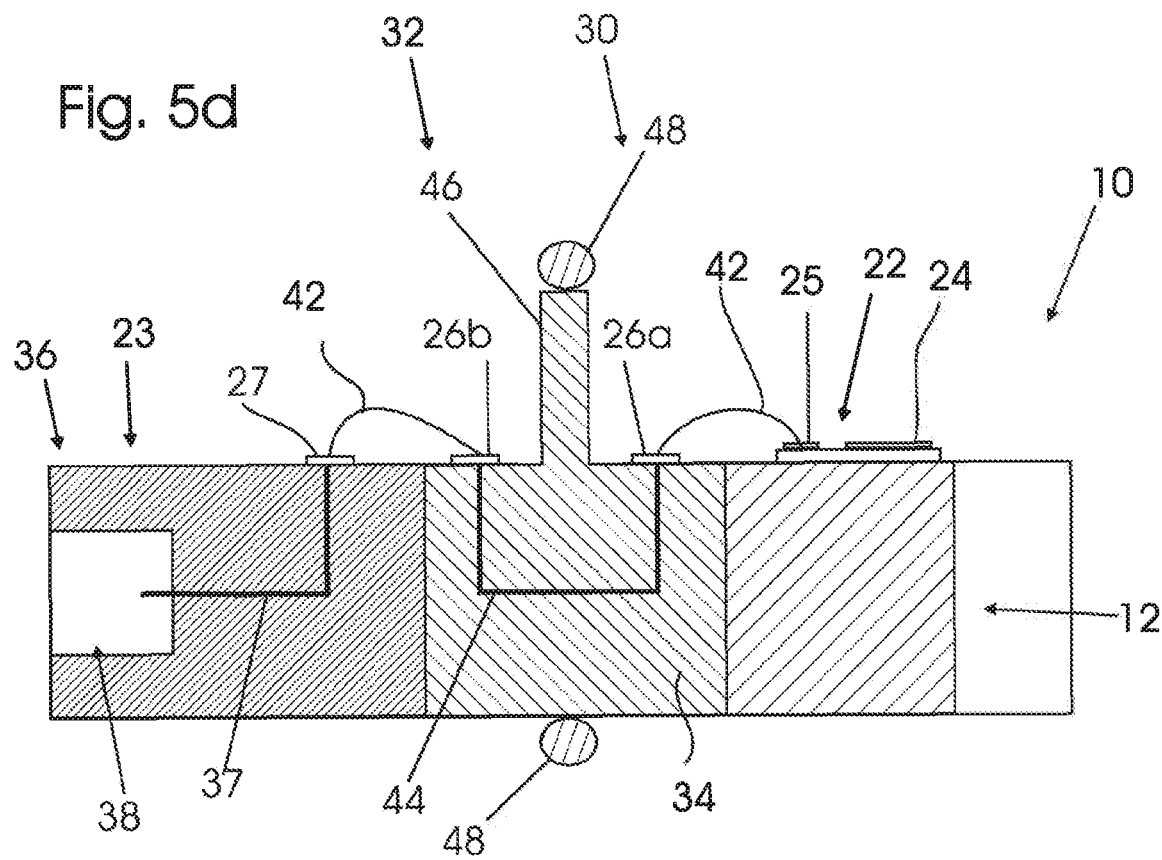

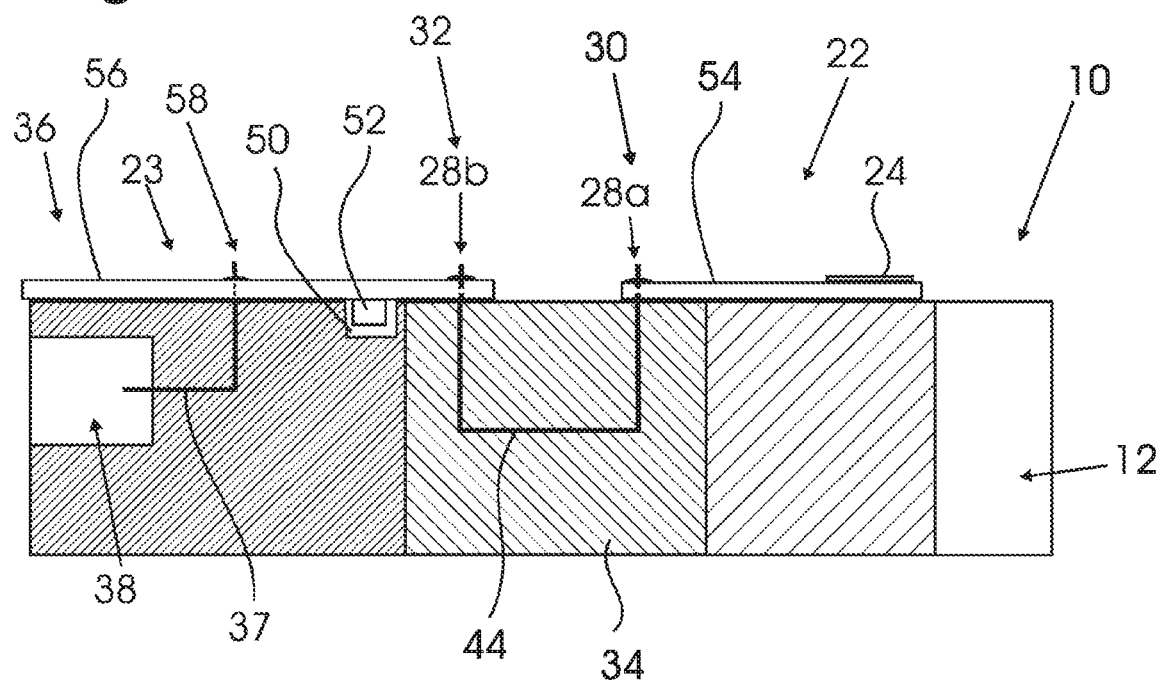

LIGHTING DEVICE WITH HIGH FLEXIBILITY IN CONNECTING ELECTRICAL COMPONENTS

CROSS REFERENCE TO RELATED APPLICATION(S)

This application claims the benefit of EP Patent Application Serial No. 19161346.2, filed Mar. 7, 2019, which is incorporated by reference as if fully set forth.

FIELD OF INVENTION

The invention relates to a lighting device and a method of manufacturing a lighting device. More particularly, the invention relates to a device including an LED element and an electrical connection assembly.

BACKGROUND

LED elements are used more and more in lighting applications due to inherent advantages such as long lifetime, energy efficiency, and small size. Many applications include high-power LEDs which are advantageous, on the one hand, because of the high luminous flux achievable. On the other hand, significant heat losses need to be dissipated.

WO 2018/069231 A1 describes a thermally self-supporting LED lighting unit comprising an LED module mounted on a heat sink and a method of manufacturing such a thermally self-supporting LED lighting unit. The LED module comprises an electrical interface to electrically connect the LED module to a power supply. The heat sink and the electrical interface are encased by an overmould.

SUMMARY

It may be considered an object to provide a lighting device and a method of manufacturing a lighting device which allow high flexibility in manufacturing.

This object is achieved by a lighting device according to claim 1 and a method of manufacturing a lighting device according to claim 13. Dependent claims refer to preferred embodiments of the invention.

In the lighting device according to claim 1, a heat sink provides a first mounting area for at least one LED element. The term "LED element" is used here to refer to any type of single solid-state lighting element or group of solid state lighting elements, such as light emitting diodes, laser diodes, organic light emitting diodes (OLED) and the like.

The heat sink may be any component that consists of any solid, thermally conductive material, preferably metal, such as aluminum or copper to dissipate the heat of electrical components such as LED elements. LED elements may be particularly sensitive to elevated temperatures, such that efficient heat dissipation is preferable.

The first mounting area may be any part of the heat sink suitable for an LED element to be mounted on. Preferably, the first mounting area provides a plane surface. It may be advantageous that the first mounting area is disposed to provide enough space such that the LED element may establish a good thermal connection. Preferably, the first mounting area is large enough such that a plurality of LED elements may be mounted on it.

Besides heat dissipation, the heat sink may have a mechanical purpose. In particular, the heat sink may act as a carrier for the LED element.

The lighting device includes a second mounting area for at least one electrical connection assembly. The electrical connection assembly may be disposed to be electrically connected to the LED element. In particular, the electrical connection assembly may serve to establish an electrical connection to supply electrical operating power to the LED element. For example, the electrical connection assembly may comprise a driver circuit or be connected to one to serve as a power supply for the LED element. The electrical connection assembly may preferably comprise one or more electrical conductors. Moreover, the electrical connection assembly may comprise electric components, e.g. electrical components that protect electronic circuits, e.g. from voltage spikes.

Preferably, the second mounting area may be conforming to a plurality of different electrical connection assemblies which may be alternatively mountable to the second mounting area.

A cavity is provided in the heat sink adjacent to the first mounting area. The cavity may be shaped in any way, such as rounded or angular shaped. It may be fully or partially surrounded by the heat sink in at least one plane. It may provide one or more apertures. Preferably, the cavity may have two apertures arranged opposite to each other, advantageously in parallel to a top plane of the heat sink such that one aperture may be in one plane with the first mounting area. The cavity may serve as a mounting space to connect components, in particular mechanically, to the heat sink. Components that are arranged within the cavity may be protected from environmental impacts. Furthermore, mounting components inside the cavity provides a compact structure as compared to mounting components on top of the heat sink. Preferably, the electrical connection assembly may be at least partially arranged within the cavity.

An inner part is arranged at least partially inside the cavity comprising at least a first and a second connection terminal and at least one electrical connection path. The inner part is a component that may be small enough to be placed at least partially inside the cavity. Further preferred, the inner part is completely inside the cavity. Preferably, the inner part may be shaped conforming with the cavity shape such that a good mechanical connection may be established. In order to facilitate the manufacturing process, the inner part and the cavity may have an at least essentially rectangular shape. Preferably, the inner part may include a solid body of electrically isolating material. The material of the inner part body may be any suitable one, preferably a plastic material, in particular an electrically isolating plastic. Further preferred, the inner part may be provided as a pre-molded component in the manufacturing process.

The first and the second connection terminal are provided on a surface of the inner part, preferably on the same surface. They are preferably arranged with a gap in between. The first connection terminal is positioned between the first mounting area and the second connection terminal. The second connection terminal is positioned between the first connection terminal and a second mounting area. The first and the second connection terminal are preferably suited to form electrical connection with attached components in particular for the LED element and/or for the electrical connection assembly. Preferably, the first and the second connection terminal may be suited to form a connection according to known electrical connection technologies such as e.g. bonding, hot stacking, soldering, etc.

Further preferred, the first connection terminal may be arranged adjacent to the first mounting area and the second connection terminal may be arranged adjacent to the second mounting area. This arrangement may be advantageous to establish a connection path between the first and the second mounting area via the first and the second connection terminal.

Further, an electrical connection path is provided at least partially inside the inner part connecting the first and the second electrical terminal. The electrical connection path may be formed, e.g. by at least one elongate electrical conductor, such as a wire, metal sheet or any other type. Preferably, the electrical connection path may be arranged completely inside the inner part with exception of both ends of this electrical connection path. The inner part may thus protect the electrical connection path from environmental impacts and from deformation.

The LED element preferably mounted on the first mounting area may be electrically connected to an electrical connection assembly mounted on the second mounting area via the inner part. The LED element may be connected to the first connection terminal. The electrical connection path connects the first connection terminal to the second one, which in turn may be connected to the electrical connection assembly. The electrical connection assembly may be connected to an external driver circuit or to another source of electrical power.

Thus, the lighting device according to the invention allows the flexibility to mount different electrical components. In particular, different types of LED elements and/or different types of electrical connection assemblies may be mounted to an assembly comprising at least the heat sink and the inner part.

Both, the first and the second connection terminal may provide any type of possible connection. According to an embodiment, the first connection terminal and the second connection terminal provide each at least one connection pin and/or at least one connection pad. The connection pin projects from the surface of the inner part, preferably pointing in normal direction of this surface and may serve to attach an electrical conductor. The connection pad may provide many different possibilities to connect an electrical component to it, e.g. via bonding. Any combination of connection pins and/or connection pad may be formed on the surface of the inner part, e.g. pin/pin, pin/pad, pad/pin, and pad/pad. To further increase flexibility, one or both connection terminals may comprise both a pin and a pad. In case that at least one connection terminal comprises both a pin and a pad, they may be connected jointly to the other connection terminal.

According to one embodiment, the surface of the inner part may be essentially in the same plane as the first mounting area. The term "essentially in the same plane" may be interpreted such that the surface of the inner part may be in a first plane and the first mounting area may be in a second plane with the first and the second plane close to each other in arrangement and/or orientation. The first and the second plane may be considered to be "essentially" the same e.g. if an angle included by the two planes and an offset in z-direction between the two planes is sufficiently small. Preferably, the angle may be less than 40°, further preferred, less than 20°, and ideally 0°. The offset may preferably be less than half of the extension of the inner part in normal direction of the surface of the inner part. Further preferred, the offset may be less than 25% of this extension, ideally there is no offset. Such an arrangement may be advantageous to electrically connect the first connection terminal with the first mounting area and/or the second connection terminal with the second mounting area. In particular some connection technologies, such as e.g. bond wires, may require short distances and minor offset or angles to bridge. The first connection terminal may be within a first connection area and the second connection terminal may be within a second connection area. A first connection area may be a section of the surface of the inner part wherein the first connection terminal is positioned. Analogously, the second connection area may be a section of the surface of the inner part wherein the second connection terminal is positioned.

In another embodiment, the first connection area may additionally comprise a third connection terminal. The second connection area may additionally comprise a fourth connection terminal. Therefore, according to this embodiment, both connection areas may each comprise at least two connection terminals. Similarly to the electrical connection path between the first and the second connection terminal, the third and the fourth connection terminal may be connected by a second electrical connection path. Thus, there may be two separate electrical connection paths between the two connection areas. This may be advantageous to connect e.g. two terminals of an LED element mounted on the first mounting area.

A further embodiment provides a sealing wall between the first and the second connection terminal and/or the first and the second connection area. The sealing wall may be provided on the inner part. The sealing wall may project from the surface of the inner part, e.g. such that the normal vector of the largest area of the sealing wall may be at least essentially orthogonal to the normal vector of the surface of the inner part. The sealing wall may divide the surface of the inner part into two zones: one comprising the first connection terminal or first connection area and one comprising the second connection terminal or second connection area. The sealing wall may be advantageous to serve as a barrier between the two zones. For example, the lighting device may be installed such that one of the zones may be provided in a sealed space, e.g. inside a housing, whereas the other of the zones may be arranged on the outside. Preferably, the LED element may be arranged within the sealed space to be protected from any pollution, such as dust or humidity. Therefore, the part of the lighting device including the LED element which may be a sensitive component, may be arranged inside a housing and its aperture may be at least partially sealed off by the sealing wall. The other part which may include connection means like an electrical plug connector may be arranged outside of the housing and may thus be accessible.

Such a sealing wall may be made of any suitable material, preferably electrically isolating. Preferably, the material may be the same as the material of the inner part. The sealing wall may be formed in one piece with the inner part body. It may be advantageous to provide the sealing wall as a part of a pre-molded part such that the inner part and the sealing wall may be manufactured in one step and as one component. This may facilitate the manufacturing process and provide a stable sealing wall, in particular a stable connection between the surface of the inner part and the sealing wall.

According to a further embodiment, the heat sink may be at least partially covered by an overmould. Any coating or cover provided on the heat sink may be considered to be an overmould, in particular if formed in a molding process such as injection molding due to the ease to obtain any desired shape. Preferably, the overmould may cover the majority of the heat sink surface leaving an opening to expose the first mounting area. Further preferred, the whole heat sink may be covered by the overmould with the exception of the first mounting area. The overmould may consist of any suitable material, preferably of a plastic material. Further preferred, the material may be thermal conductive. It may also be an electrically isolating plastic or both electrically isolating and thermal conductive.

In a further embodiment, the material of the overmould and the material of the inner part may be the same.

According to another embodiment, the second mounting area may provide at least one fixing element for the electrical connection assembly. A fixing element may be any component that may facilitate the attachment of the electrical connection assembly. Preferably, the fixing element may enable to fix different types of electrical connection assemblies such that the fixing element is not limited to one kind of electrical connection assembly. Examples for such a fixing element may be a screw, a screw thread, or a pin for hot staking. The fixing element may be attached directly to the heat sink. If the heat sink is covered by an overmould, it may be preferred that the fixing element is attached to the overmould. It may also be of the same material as the overmould or even be part of the overmould such that the overmould including the fixing element may be manufactured in one single step.

The fixing element may be fixed at any position, preferably within the cavity. It may be attached to a surface of the inner part which may form one side wall of the cavity. If the heat sink has an H-shape, the fixing element may preferably be attached to one of the parallel sides.

In a preferred embodiment, a wire connects the first connection terminal to the LED element. In case of a plurality of LED elements, it may be preferred that every LED element is connected by a separate wire to a connection terminal, advantageously within the first connection area. This wire may preferably be connected by any kind of bonding process. The bonded connection may be favorable due to the flexible arrangement of the single components. Both components, the heat sink and the inner part may be manufactured separately and late in the manufacturing process the electrical connection may be established by a wire. The wire may e.g. be a bond wire, or a ribbon cable. There may also be several wires arranged in parallel, e.g. in a ribbon cable.

A possibility to connect the lighting device to an external power supply may be provided according to one embodiment including an electrical connection assembly that comprises an electrical connector. The electrical connector may e.g. be a plug/socket connector, which may be suitable to connect to a power supply.

According to one embodiment, the electrical connection assembly may comprise a printed circuit board (PCB) and/or a metal sheet, e.g. of a lead frame. The PCB or lead frame may comprise a plurality of electrical components such as a connector, a resistor, transient-voltage-suppression diode or any other electrostatic discharge protection, or a thermal sensor exemplary based on electrical materials with a negative or positive temperature coefficient. The PCB or lead frame, may e.g. be disposed to establish a connection from the inner part to an external component, e.g. a driver circuit. Thus, the electrical connection assembly may comprise a plurality of freely chosen electrical components. The desired electrical components may be mounted and connected easily onto the PCB.

In a preferred embodiment, a carrier, for example a circuit board, may cover at least partially the first mounting area and the neighboring first connection area, and/or a carrier (e.g. circuit board) may cover at least partially the second mounting area and the neighboring second connection area. Such a carrier may comprise one or more electrical conductors as well as further electrical components. The carrier covering the second mounting area and the second connection area preferably may constitute the electrical connection assembly or be a part of it. Further preferred, the carrier comprising the electrical connection assembly may be a PCB.

It may be advantageous that a part of the electrical components of e.g. the electrical connection assembly may be on top of the carrier. An arrangement of electrical components hidden and protected inside the cavity may be preferred. According to this embodiment, the electrical components inside the cavity may preferably be mounted onto the bottom side of the carrier.

The carrier covering the first mounting area and the first connection area preferably comprises the LED element, e.g. as a Chip-on-Board-LED.

To electrically connect the carrier with the first or second mounting area and with the first or second connection area, connection technologies using conductive glue or soldering may be applied.

Soldering may require connection pins within the first and/or second mounting area and/or within the first and/or second connection area. Further, corresponding holes within the carrier may be required. The pins may be plugged into the holes and soldered onto the surface that is not facing the first or second mounting area.

Thus, the carrier may electrically connect the first mounting area with the first connection area and/or the second mounting area with the second connection area without requiring any wire. Electrical connections may already be part of the carrier.

The method according to claim 13 provides manufacturing a lighting device, preferably a lighting device according to claim 1. The method comprises the steps of providing a heat sink, arranging an inner part, arranging an electrical connection assembly and arranging an LED element. The heat sink, the inner part, the electrical connection assembly and the LED element may be as described above. The heat sink comprises a first mounting area and a cavity which is adjacent to the first mounting area. The first mounting area and the cavity may be as described above.

Preferably, one step of the method may be to provide a pre-assembly at least by arranging the inner part inside the cavity. The pre-assembly may preferably comprise elements to provide mechanical, thermal and/or electrical contacting functionalities for electrical components.

It may be preferred that the pre-assembly is disposed such that it may be conforming to a plurality of different electrical components which may be alternatively mountable to the first or second mounting area. Preferably, the pre-assembly itself does comprise a minimum of electrical components. Further preferred it does not comprise any electrical components besides electrical contacts and conductors. Thus, it may be advantageous that the pre-assembly comprises all components of the finished lighting device except for any electrical component, e.g. the LED element, bond wires or the electrical connection assembly.

Preferably in a step following providing the pre-assembly, an LED element may be mounted and connected at the first mounting area and/or an electrical connection assembly may be mounted and connected at the second mounting area. Mounting and connecting the electrical connection assembly and the LED element may be performed simultaneously or successively.

It may be advantageous to mount and connect all electrical components in a step that occurs rather late while performing the method in order to allow a flexibility in the choice of electrical components. The pre-assembly may be manufactured independently from the LED element and independently from the electrical connection assembly that may be connected afterwards. The pre-assembly may comprise the heat sink, the inner part and further preferred the overmould and the fixing element. It may be manufactured such that it provides the first and the second mounting area. Furthermore, it provides the electrical connection path and at least the first and second connection terminal, preferably a plurality of electrical connection terminals and further preferred different kinds of electrical connection terminals, e.g. connection pins and connection pads. Thus, the electrical connection between the LED element at the first mounting area and the electrical connection assembly at the second mounting area may easily be provided by connecting the LED element to the first connection terminal and the electrical connection assembly to the second connection terminal, e.g. by bonding. Thereby, different embodiments of the lighting device may easily be manufactured by only adapting the last manufacturing step of the method of manufacturing the lighting device. The pre-assembly may be manufactured and the different electrical components, the appropriate connection technology to connect the electrical components to the first and to the second connection terminal may then be chosen afterwards.

According to a preferred embodiment, the second mounting area may be provided with at least one fixing element before the step of arranging the electrical connection assembly at the second mounting area and the LED element at the first mounting area. The fixing element may be as described above. It may be advantageous to provide an element that is disposed to fix an electrical connection assembly mechanically, whereby the fixing element may be conforming with different kinds of electrical connection assemblies such that the electrical connection assembly may be fixed by the fixing element in a following step. The usage of a fixing element which is conforming with different embodiments of the electrical connection assembly may be advantageous because it provides the flexibility to select the electrical connection assembly in a following step. At first, the fixing element may be provided and then the electrical connection assembly may be chosen and mechanically fixed by the fixing element.

According to a preferred embodiment, the heat sink may be at least partially covered with an overmould before the step of arranging the electrical connection assembly at the second mounting area and the LED element at the first mounting area. The overmould may be as described above. The overmould may preferably expose the first mounting area and the inner part such that the heat sink may be covered and protected by the overmould, thus leaving a choice of which type of electrical connection assembly and/or LED element are mounted in a following step.

BRIEF DESCRIPTION OF THE DRAWING(S)

The above and other features, objects and advantages of the present invention will become apparent from the following description of preferred embodiments, in which FIG. 1 shows a first embodiment of a lighting device in a perspective view;

FIG. 4 shows an exploded view of the lighting device of FIG. 1;

FIG. 5b, 5c, 5d, 5e show in side view longitudinal sections of further embodiments of lighting devices.

DETAILED DESCRIPTION OF THE PREFERRED EMBODIMENT(S)

Figure 1:
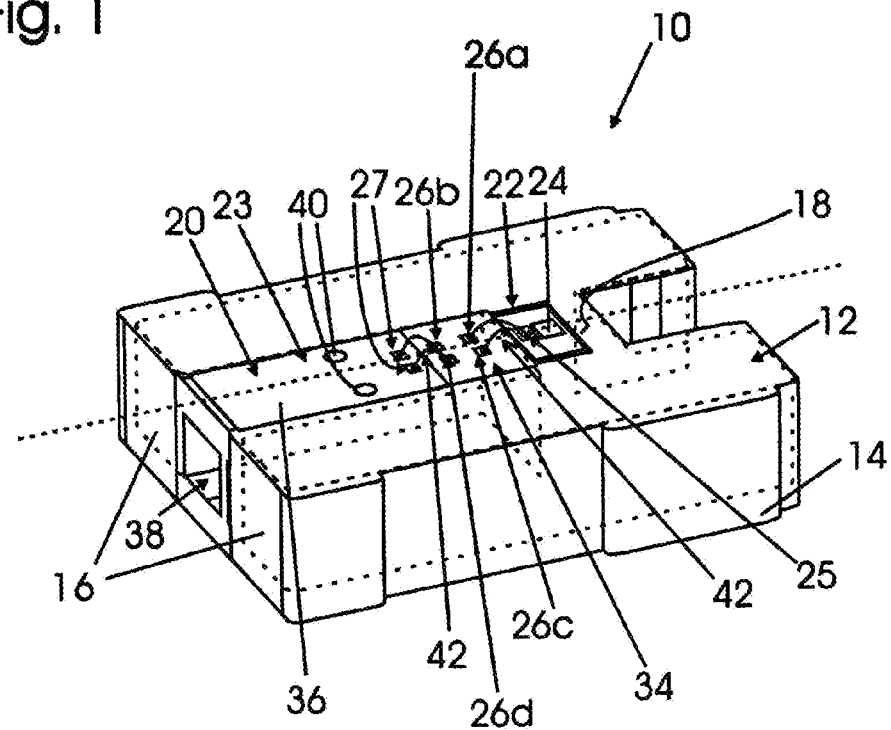

FIG. 1 and FIG. 4 show a first embodiment of a lighting device 10. The lighting device 10 comprises a heat sink 12 covered by an overmould 14. The heat sink 12 is a massive body out of metal with an H-shape consisting of two parallel sides 16 and a connecting piece 18 of the heat sink 12 that is perpendicular to the two sides 16. The two parallel sides 16 and the connecting piece 18 border a cavity 20 with two opposite top and bottom apertures and a side aperture opposite to the connecting piece 18 at the ends of the two parallel sides 16. The overmould 14 exposes a square area on the top surface of the connecting piece 18 of the heat sink 12. This square area is a first mounting area 22. At this first mounting area 22, an LED 24 with two connection pads 25 is mounted on the surface of the heat sink 12.

An inner part 34 is arranged within the cavity 20. The inner part 34 has the same width as the cavity 20 which corresponds to the distance between the two parallel sides 16 of the heat sink 12 such that the inner part 34 fits exactly between them. Thus, the inner part 34 is arranged adjacent to the connecting piece 18 and to the two parallel sides 16 within the cavity 20 they form. The height of the inner part 34 is equal to the depth of the cavity 20, such it is arranged completely inside the cavity 20.

On the top surface of the inner part 34, adjacent to the border between the inner part 34 and the connecting piece 18 of the heat sink 12, a first connection area 30 and a second connection area 32 are arranged. A first connection pad 26a is arranged within the first connection area 30 and a second connection pad 26b is arranged within the second connection area 32. Further, a third connection pad 26c is arranged within the first connection area 30 and a fourth connection pad 26d is arranged within the second connection area 32.

The first connection area 30 and the second connection area 32 are arranged on top of the inner part 34 with a gap in between. Inside the cavity 20, there is a second mounting area 23 which comprises the part of the cavity 20 that is limited by the two parallel sides 16, the inner part 34, and the side aperture.

Two screw threads 41 are attached at the overmould 14 inside the cavity 20. With appropriate screws 40, they are disposed to mechanically fix components at the second mounting area 23.

An electrical connection assembly 36 comprises two connection pads 27 arranged on the top surface. Furthermore, it comprises a connection jack 38. The connection jack 38 serves to connect the lighting device 10 to an external driver circuit.

The electrical connection assembly 36 is mounted at the second mounting area 23 such that it is adjacent to the inner part 34. It is mechanically connected and fixed by the screws 40.

The top surfaces of the heat sink 12, the inner part 34 and the electrical connection assembly 36 are arranged such that they are in one plane.

The heat sink 12, the inner part 34 and the electrical connection assembly 36 are electrically connected by bond wires 42. The connection pads 25 of the LED 24 are connected by bond wires 42 to the connection pads 26a and 26c of the first connection area 30. Furthermore, bond wires 42 connect the connection pads 26b and 26d of the second connection area 32 to the connection pads 27 of the electrical connection assembly 36.

Thus, the LED 24 is connected to the first connection area 30 on the top surface of the inner part 34 and the electrical connection assembly 36 is connected to the second connection area 32 on the top surface of the inner part 34.

Figure 5A:
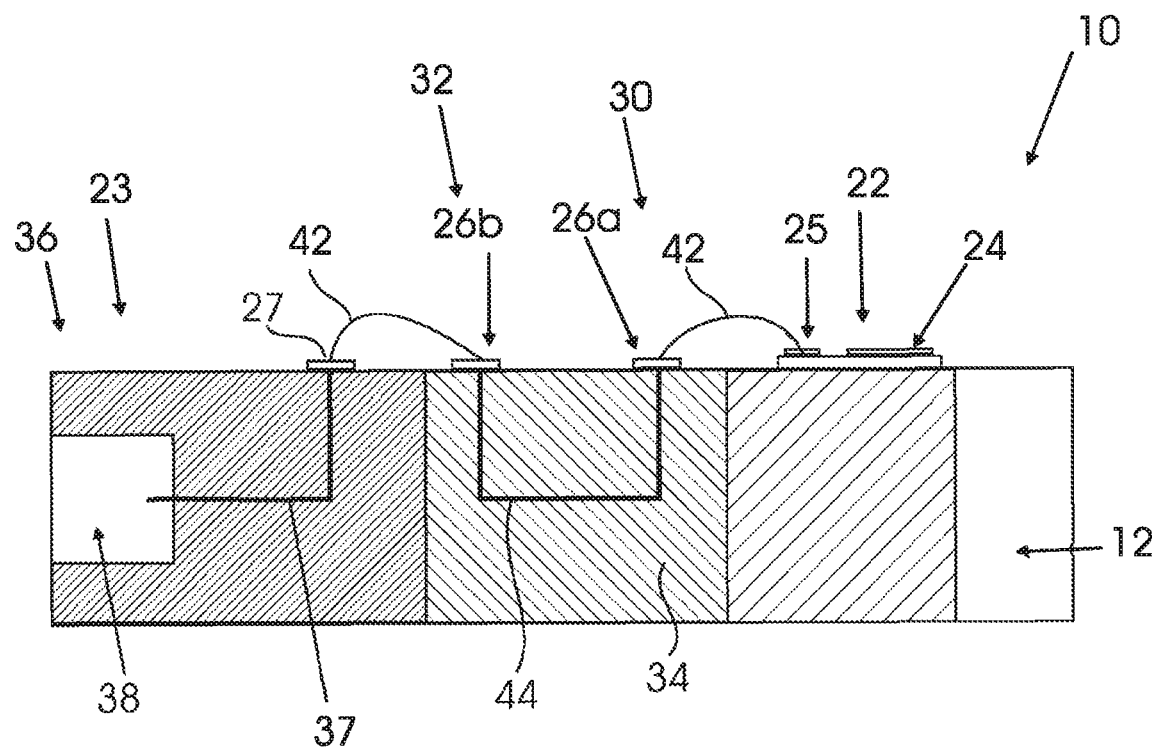
FIG. 5a shows in side view a longitudinal section of the lighting device of FIG. 1, 4.

To connect the LED 24 with the connection jack 38 in order to be connected to an external driver circuit or other source of electrical power, a series of electrical connections is provided. FIG. 5a illustrates the electrical connection between the LED 24 and the connection jack 38. The connection pads 25 of the LED 24 are connected via bond wires 42 to the connection pads 26a, 26c of the first connection area 30.

As shown in FIG. 5a, an electrical connection path 44 that is embedded inside the inner part 34 connects the connection pad 26a of the first connection area 30 with the connection pad 26b of the second connection area 32. The connection pad 26c of the first connection area 30 and the connection pad 26d of the second connection area 32 are analogously connected by an electrical connection path that is not shown in FIG. 5a. The connection pads 26b, 26d of the second connection area 32 are connected via bond wires 42 to the connection pads 27 of the electrical connection assembly 36. The electrical connection assembly 36 itself also comprises an embedded electrical connection 37 connecting the connection pads 27 with the connection jack 38. The bond wires 42 connect single pieces of electrical connections to one electrical connection between the LED 24 and the connection jack 38 by joining the two junctions between the inner part 34 and the heat sink 12 and between the inner part 34 and the electrical connection assembly 36.

Figure 2:
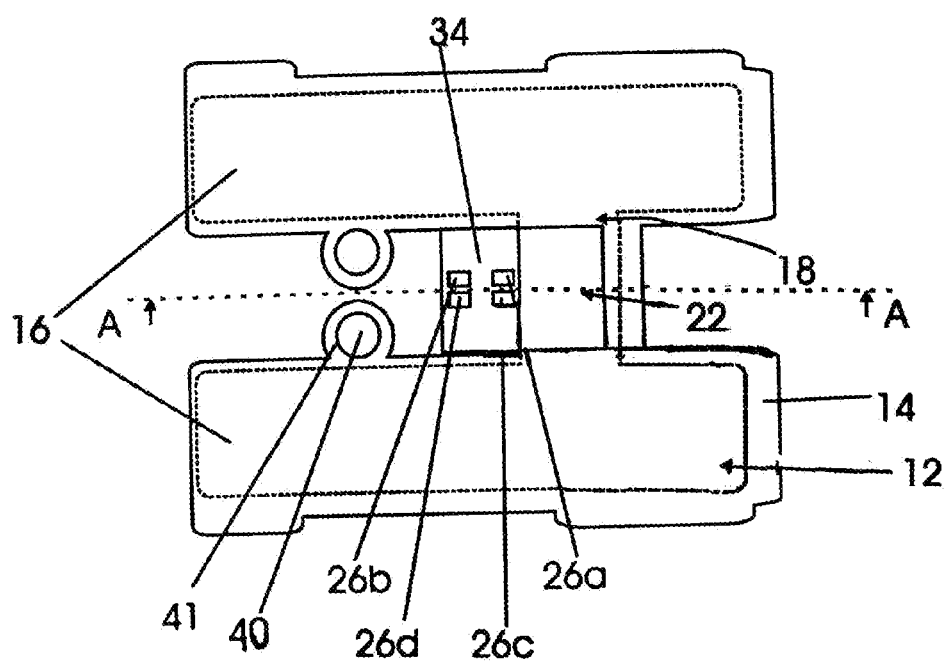
FIG. 2 shows a top view of a pre-assembly.
Figure 3:
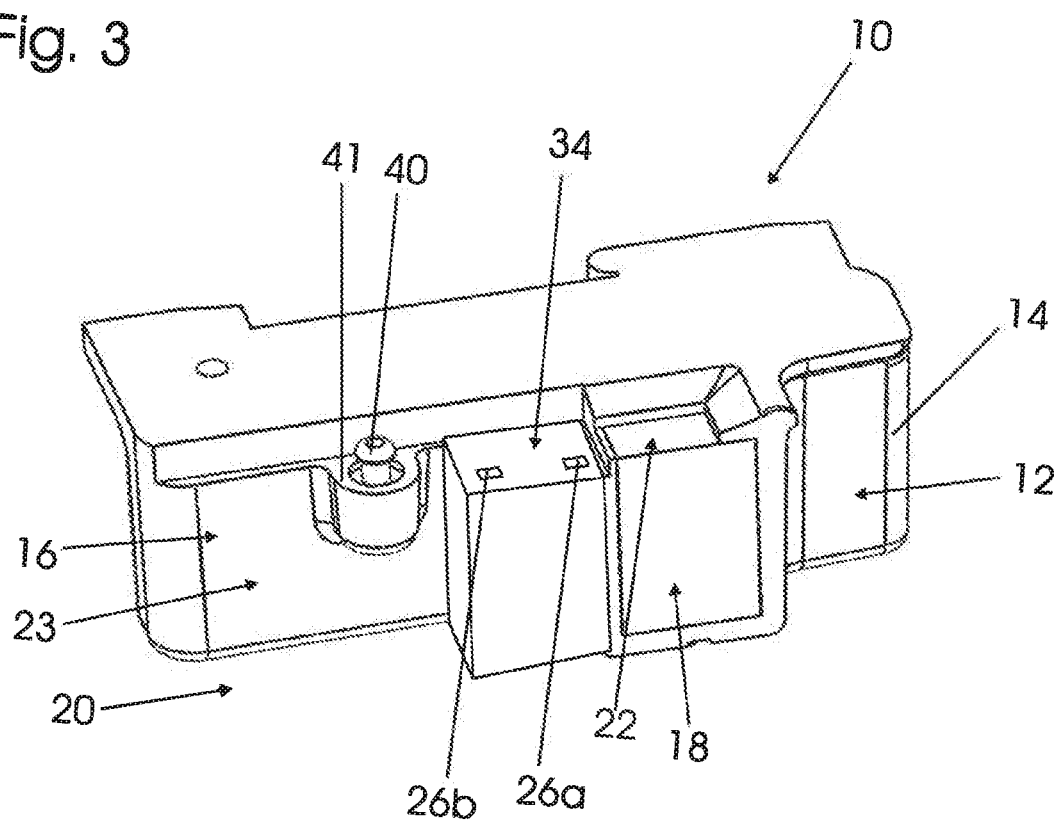
FIG. 3 shows a perspective view of a longitudinal section of the pre-assembly of FIG. 2 with the section along A . . . A.

The lighting device 10 is manufactured in multiple steps. At first, the heat sink 12 in an H-shape and the inner part 34 which comprises connection pads 26a, 26b, 26c, 26d and the electrical connection path 44 are manufactured. The inner part 34 is pre-molded and inserted in the cavity 20 of the heat sink 12. The heat sink 12 is then covered by the overmould 14 including the screw thread 41 at the second mounting area 23. The overmould 14 exposes the first mounting area 22 on the top surface of the heat sink 12. Thus, the heat sink 12, the inner part 34 and the overmould 14 are mechanically connected and form a pre-assembly of the lighting device 10 as shown in FIG. 2, 3.

In a last step, the electrical components and further electrical connections are added. On the first mounting area 22, the LED 24 is mounted. The first mounting area 22 provides space where the LED 24 with its connection pads 25 can be mounted. Thus, many different kinds of LEDs 24 are compatible with the first mounting area 22 and it is a flexible choice which LED 24 is finally added to the pre-assembly.

At the second mounting area 23, the electrical connection assembly 36 is mounted. Many different kinds of electrical connection assemblies 36 are compatible with the second mounting area 23. Different embodiments of PCBs or lead frames that mechanically conform to the second mounting are 23 can be mounted. The electrical components of the PCB for example can be chosen freely. Thus, it is a flexible choice which electrical connection assembly 36 finally is chosen to be added to the pre-assembly.

In particular, the pre-assembly allows flexibility concerning the connection terminals such that different connection technologies are compatible with the pre-assembly in order to increase the flexibility in the choice of mountable electrical components.

Figure 5B:
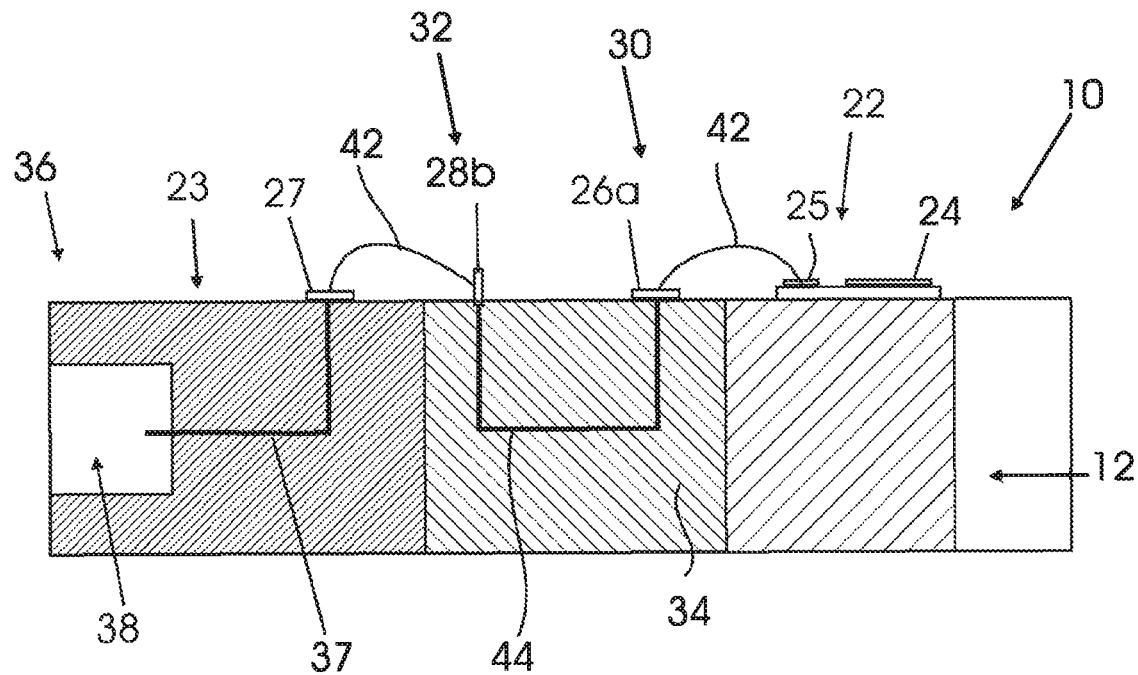

FIGS. 5b, 5c and 5d show further embodiments of the lighting device 10 with different connection terminals.

FIG. 5b shows a second embodiment of the lighting device 10 which differs from the lighting device shown in FIG. 5a in the second connection area 32. While the second connection area 32 of the lighting device shown in FIG. 5a comprises connection pads 26b, 26d, the second connection area 32 of the second embodiment shown in FIG. 5b comprises two connection pins whereof one connection pin 28b within the second connection area 32 is shown in FIG. 5b. The first connection area 30 in this embodiment also comprises connection pads 26a, 26c.

FIG. 5c shows a third embodiment of the lighting device 10 which only differs from the second embodiment shown in FIG. 5b in the first connection area 30. The first connection area 30 of this embodiment also comprises two connection pins whereof one connection pin 28a is illustrated in FIG. 5c. Thus, both, the first and the second connection area 30, 32 comprise connection pins 28a, 28b.

FIG. 5d shows a fourth embodiment of the lighting device 10. It agrees with the first embodiment except for a sealing wall 46 and a sealing ring 48. The sealing wall 46 is arranged on the top surface of the inner part 34 and perpendicular to this surface. It is positioned between the first connection area 30 and the second connection area 32.

Around the lighting device 10, held by the sealing wall 46, the sealing ring 48 is arranged. The sealing wall 46 and the sealing ring 48 are disposed to seal one portion of the lighting device 10 when it is installed e.g. in a housing.

FIG. 5e shows a fifth embodiment of the lighting device 10. It comprises the same pre-assembly as the other four embodiments. The connected electrical components and the applicated electrical connection technologies differ. The LED 24 is a CoB-LED 24 on a first PCB 54 mounted on the first mounting area 22. The first PCB 54 connects the first mounting area 22 with the first connection area 30 electrically by electrical connections. The electrical connection path 44 connects the first PCB 54 with a second PCB 56 which is part of the electrical connection assembly 36. The second PCB 56 is mounted at the second connection area 32 and on the second mounting area 23. Comparable to the first PCB 54, the second PCB 56 also provides an electrical connection. The first and the second PCB 54, 56 are connected to the connection pins 28a, 28b by soldering. The pre-assembly comprises connection pins 28a, 28b within the first and the second connection area 30, 32.

The first and the second PCB 54, 56 include holes through which the connection pins 28a, 28b project. On the top side of the PCBs 54, 56, the connection pins 28a, 28b are connected by soldering.

The second PCB 56 is connected to the connection 37 to the connection jacket 38 by a pin 58. Further, the second PCB 56 comprises electrical components 52, which may be mounted on the top and on the bottom side of the PCB 56. Mounting cavities 50 may be provided for electrical components 52 mounted on the bottom side of the second PCB 56.

The implementation of connection pads 26a, 26b, 26c, 26d or connection pins 28a, 28b allows to employ different kinds of connection technologies. Except for the bond wires 42, all connection pads 26a, 26b, 26c, 26d, connection pins 28a, 28b and electrical connections are installed inside or on the top surface of the pre-assembly.

It should be noted that the above-mentioned embodiments illustrate rather than limit the invention, and that those skilled in the art will be able to design many alternative embodiments without departing from the scope of the appended claims.

In particular the sealing wall is shown exemplary in one embodiment. It may also be part of every other embodiment. Furthermore, size, position or material are exemplary parameters of the sealing wall that may be chosen differently.

In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

What is claimed is:

1. A lighting device comprising:
   a heat sink comprising:
   a first mounting area,
      a second mounting area comprising an electrical connection assembly,
      a cavity in the heat sink adjacent the first mounting area, and
      an inner part comprising a first connection terminal and a second connection terminal on a surface of the inner part and an electrical connection path at least partially inside the inner part and electrically coupled between the first connection terminal and the second connection terminal, the second connection terminal being electrically coupled to the electrical connection assembly of the second mounting area,
      the inner part arranged at least partially within the cavity with the first connection terminal between the first mounting area and the second connection terminal and the second connection terminal between the second mounting area and the first connection terminal; and
   a light-emitting diode (LED) element mounted on the first mounting area and electrically coupled to the first connection terminal of the inner part.

2. The lighting device according to claim 1, wherein the first connection terminal and the second connection terminal comprise at least one connection pin.

3. The lighting device according to claim 1, wherein the first connection terminal and the second connection terminal comprise at least one connection pad.

4. The lighting device according to claim 1, wherein the surface of the inner part and the first mounting area are substantially in the same plane.

5. The lighting device according to claim 1, further comprising:
   a first connection area that comprises a third connection terminal and the first connection terminal; and
   a second connection area that comprises a fourth connection terminal and the second connection terminal; and
   a second electrical connection path electrically coupled between the third connection terminal and the fourth connection terminal.

6. The lighting device according to claim 1, further comprising a sealing wall between the first connection terminal and the second connection terminal.

7. The lighting device according to claim 1, wherein the heat sink further comprises an overmold at least partially covering the heat sink.

8. The lighting device according to claim 7, wherein the overmold is made from the same material as the inner part.

9. The lighting device according to claim 1, wherein the second mounting area comprises at least one fixing element for the electrical connection assembly.

10. The lighting device according to claim 1, further comprising a wire electrically coupling the first connection terminal and the LED element.

11. The lighting device according to claim 1, wherein the electrical connection assembly comprises an electrical connector.

12. The lighting device according to claim 1, wherein the electrical connection assembly comprises at least one of a printed circuit board or a metal sheet.

13. The lighting device according to claim 1, further comprising a carrier that covers at least partially the first mounting area and at least partially the first connection area.

14. The lighting device according to claim 13, wherein the carrier further covers at least partially the second mounting area and at least partially the second connection area.

15. The lighting device according to claim 1, further comprising a carrier that covers at least partially the second mounting area and at least partially the second connection area.

16. A method of manufacturing a lighting device, the method comprising:
   providing a heat sink comprising a first mounting area, a second mounting area and a cavity adjacent the first mounting area;
   mounting a light-emitting diode (LED) element on the first mounting area;
   arranging an electrical connection assembly at the second mounting area;
   providing an inner part having a surface comprising a first connection terminal and a second connection terminal that are electrically coupled via an electrical connection path at least partially inside the inner part;
   arranging the inner part at least partially inside the cavity such that the first connection terminal is between the first mounting area and the second connection terminal and the second connection terminal is between the first connection terminal and the second mounting area;
   electrically coupling the first connection terminal to the LED element; and
   electrically coupling the second connection terminal to the electrical connection assembly.

17. The method according to claim 16, wherein the arranging the inner part at least partially inside the cavity comprises providing a pre-assembly, and the arranging the electrical connection assembly and the mounting the LED element comprise arranging the electrical connection assembly and mounting the LED element to the pre-assembly.

18. The method according to claim 16, further comprising providing at least one fixing element at the second mounting area before the arranging the electrical connection assembly at the second mounting area.

19. The method according to claim 16, further comprising covering the heat sink at least partially with an overmold before arranging the electrical connection assembly at the second mounting area and mounting the LED element at the first mounting area.

20. The method according to claim 16, wherein the electrically coupling the first connection terminal to the LED element comprises electrically coupling the first connection terminal to the LED element using a wire, and the electrically coupling the second connection terminal to the electrical connection assembly comprises electrically coupling the second connection terminal to the electrical connection assembly using a wire.

* * * * *